United States Patent
Yamazaki et al.

(10) Patent No.: US 8,735,263 B2
(45) Date of Patent: May 27, 2014

(54) METHOD FOR MANUFACTURING SOI SUBSTRATE

(75) Inventors: Shunpei Yamazaki, Tokyo (JP); Junichi Koezuka, Tochigi (JP); Kazuya Hanaoka, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 193 days.

(21) Appl. No.: 13/346,754

(22) Filed: Jan. 10, 2012

(65) Prior Publication Data

US 2012/0190171 A1 Jul. 26, 2012

(30) Foreign Application Priority Data

Jan. 21, 2011 (JP) ................. 2011-010797

(51) Int. Cl.
*H01L 21/30* (2006.01)
*H01L 21/46* (2006.01)

(52) U.S. Cl.
USPC ............ 438/458; 257/E21.563; 257/E21.567; 257/E21.568; 438/406; 438/455

(58) Field of Classification Search
USPC .................. 257/E21.563, E21.567, E21.568; 438/406, 455, 458
See application file for complete search history.

(56) References Cited

U.S. PATENT DOCUMENTS

| | | | |
|---|---|---|---|
| 6,372,609 B1 | 4/2002 | Aga et al. | |
| 6,583,440 B2 | 6/2003 | Yasukawa | |
| 7,084,046 B2 | 8/2006 | Mitani et al. | |
| 7,763,502 B2 | 7/2010 | Kakehata et al. | |
| 7,767,542 B2 | 8/2010 | Ohnuma et al. | |
| 7,790,563 B2 | 9/2010 | Kakehata | |
| 7,790,572 B2 | 9/2010 | Moriwaka | |
| 7,829,434 B2 | 11/2010 | Yamazaki et al. | |
| 7,875,532 B2 | 1/2011 | Kakehata et al. | |
| 7,897,476 B2 | 3/2011 | Yamazaki et al. | |
| 7,902,034 B2 | 3/2011 | Yamazaki et al. | |
| 7,910,457 B2 | 3/2011 | Yamazaki | |
| 8,034,694 B2 | 10/2011 | Ohnuma et al. | |
| 8,048,728 B2 | 11/2011 | Yamazaki | |
| 8,088,669 B2 | 1/2012 | Yamazaki | |
| 2002/0155679 A1* | 10/2002 | Ogura et al. | 438/423 |
| 2007/0056316 A1* | 3/2007 | Platow et al. | 62/532 |
| 2008/0284710 A1 | 11/2008 | Kimura et al. | |
| 2008/0286910 A1 | 11/2008 | Yamazaki et al. | |
| 2009/0075408 A1 | 3/2009 | Yamazaki | |
| 2009/0098709 A1 | 4/2009 | Ohnuma et al. | |
| 2009/0098739 A1 | 4/2009 | Ohnuma et al. | |

(Continued)

FOREIGN PATENT DOCUMENTS

| JP | 2000-124092 | 4/2000 |
|---|---|---|
| JP | 2002-170942 | 6/2002 |

*Primary Examiner* — Asok K Sarkar
(74) *Attorney, Agent, or Firm* — Nixon Peabody LLP; Jeffrey L. Costellia

(57) ABSTRACT

An SOI substrate is manufactured by the following steps: a semiconductor substrate is irradiated with an ion beam in which the proportion of $H_2O^+$ to hydrogen ions ($H_3^+$) is lower than or equal to 3%, preferably lower than or equal to 0.3%, whereby an embrittled region is formed in the semiconductor substrate; a surface of the semiconductor substrate and a surface of a base substrate are disposed so as to be in contact with each other, whereby the semiconductor substrate and the base substrate are bonded; and a semiconductor layer is separated along the embrittled region from the semiconductor substrate which is bonded to the base substrate by heating the semiconductor substrate and the base substrate, so that the semiconductor layer is formed over the base substrate.

19 Claims, 8 Drawing Sheets

(56) References Cited

U.S. PATENT DOCUMENTS

| | | |
|---|---|---|
| 2009/0111248 A1 | 4/2009 | Ohnuma et al. |
| 2009/0117707 A1 | 5/2009 | Shimomura et al. |
| 2009/0137101 A1 | 5/2009 | Yamazaki et al. |
| 2010/0087044 A1 | 4/2010 | Shichi et al. |
| 2010/0255645 A1 | 10/2010 | Yamazaki et al. |
| 2010/0273310 A1 | 10/2010 | Hanaoka et al. |
| 2010/0330777 A1 | 12/2010 | Hanaoka |
| 2011/0086492 A1 | 4/2011 | Ohnuma et al. |

* cited by examiner

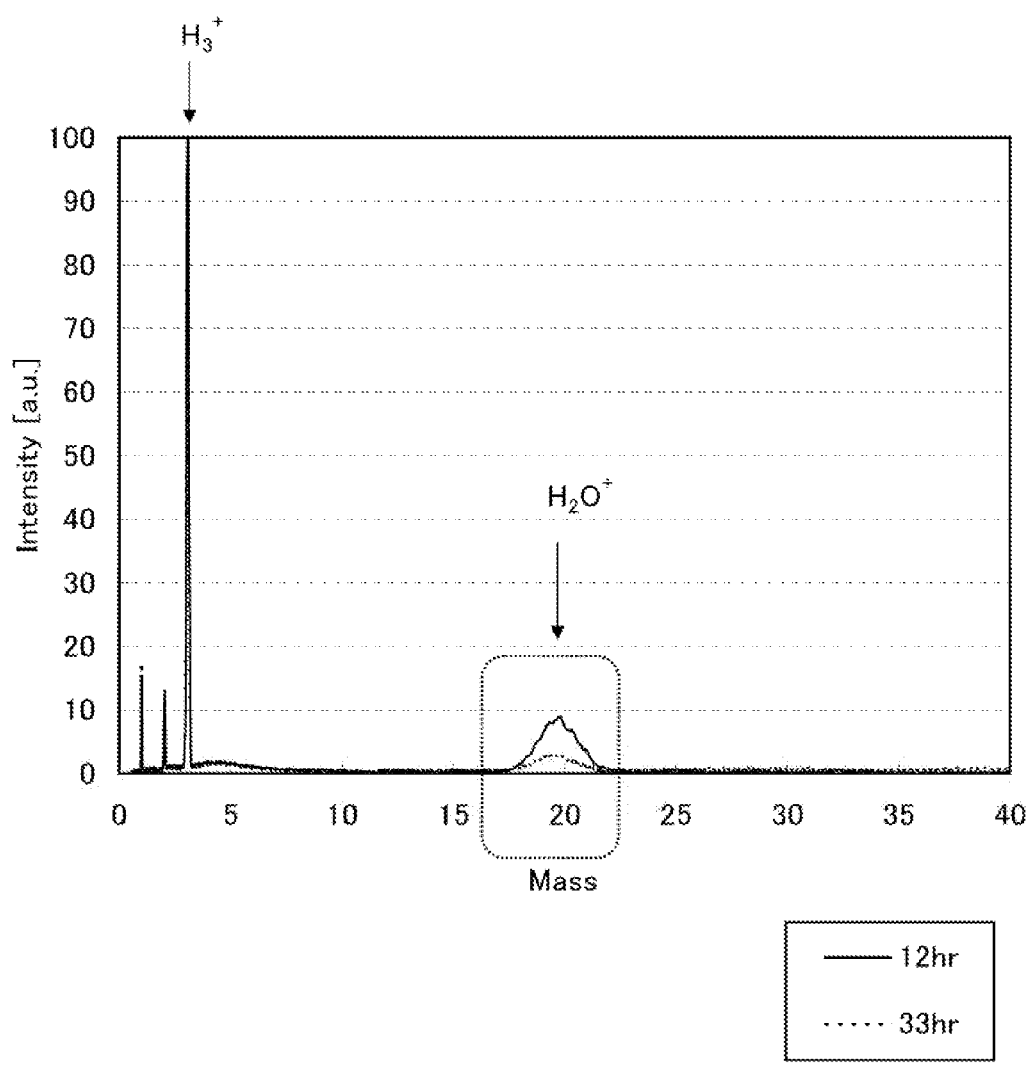

METHOD FOR MANUFACTURING SOI SUBSTRATE

BACKGROUND OF THE INVENTION

1. Field of the Invention

One embodiment of the invention to be disclosed relates to a method for manufacturing an SOI substrate.

2. Description of the Related Art

In recent years, an integrated circuit using an SOI (silicon on insulator) substrate in which a thin single crystal semiconductor layer is formed on an insulating surface, instead of a bulk silicon wafer has been developed. The use of an SOI substrate enables parasitic capacitance between a drain of a transistor and a substrate to be reduced; thus, SOI substrates are attracting attention for their ability to improve performance of semiconductor integrated circuits.

One of known methods for manufacturing SOI substrates is a hydrogen ion implantation separation method (for example, see Patent Document 1). A summary of a method for manufacturing an SOI substrate with use of a hydrogen ion implantation separation method is as follows. First, hydrogen ions are implanted into a silicon wafer by an ion implantation method to form a microbubble layer at a predetermined depth from the surface. Next, the silicon wafer into which the hydrogen ions have been implanted is bonded to another silicon wafer with a silicon oxide film interposed therebetween. Then, by heat treatment, the microbubble layer serves as a cleavage plane and a part of the silicon wafer into which the hydrogen ions have been implanted is separated in a thin film shape along the microbubble layer. Accordingly, a single crystal silicon film can be formed over the other bonded silicon wafer.

A method for forming a single crystal silicon layer over a base substrate made from glass with use of such a hydrogen ion implantation method as described above has been proposed (for example, see Patent Document 2). Glass substrates can be manufactured in larger sizes and are less expensive than silicon wafers. Thus, with use of a glass substrate as a base substrate, a large-sized inexpensive SOI substrate can be manufactured.

A single crystal semiconductor substrate is irradiated with accelerated hydrogen ions, whereby implantation of the hydrogen ions or doping with the hydrogen ions is performed on part of the single crystal semiconductor substrate at a predetermined depth to form an embrittled region there. Then, heat treatment is performed. Through the heat treatment, hydrogen contained in the embrittled region is expanded, so that a cleavage plane is formed in the embrittled region.

REFERENCE

[Patent Document 1] Japanese Published Patent Application No. 2000-124092

[Patent Document 2] Japanese Published Patent Application No. 2002-170942

SUMMARY OF THE INVENTION

However, when irradiation with hydrogen ions is performed with use of an ion doping apparatus, in addition to hydrogen ions, oxygen or a compound containing oxygen (e.g., water ($H_2O$)) is also added to a semiconductor substrate. If a semiconductor layer is separated from such a semiconductor substrate to which oxygen is added, oxygen might cause defects in the semiconductor layer.

Further, when a semiconductor device is manufactured using the semiconductor layer with defects derived from oxygen, the reliability of the manufactured semiconductor device might be degraded.

In view of the aforementioned problems, an object of one embodiment of the invention to be disclosed is to provide a semiconductor layer with fewer defects.

Another object of one embodiment of the invention to be disclosed is to obtain a highly reliable semiconductor device.

One embodiment of the invention to be disclosed is a method for manufacturing an SOI substrate including the steps of: irradiating a semiconductor substrate with an ion beam in which a proportion of $H_2O^+$ to hydrogen ions ($H_3^+$) is lower than or equal to 3%, so that an embrittled region is formed in the semiconductor substrate; bonding the semiconductor substrate and a base substrate by being in contact with a surface of the semiconductor substrate and a surface of the base substrate; and separating a semiconductor layer along the embrittled region from the semiconductor substrate which is bonded to the base substrate by heating the semiconductor substrate and the base substrate, so that the semiconductor layer is formed over the base substrate.

One embodiment of the invention to be disclosed is a method for manufacturing an SOI substrate including the steps of: irradiating a semiconductor substrate with an ion beam in which a proportion of $H_2O^+$ to hydrogen ions ($H_3^+$) is lower than or equal to 0.3%, so that an embrittled region is formed in the semiconductor substrate; bonding the semiconductor substrate and a base substrate by being in contact with a surface of the semiconductor substrate and a surface of the base substrate; and separating a semiconductor layer along the embrittled region from the semiconductor substrate which is bonded to the base substrate by heating the semiconductor substrate and the base substrate, so that the semiconductor layer is formed over the base substrate.

According to one embodiment of the invention to be disclosed, the ion beam is an ion beam in which a proportion of carbon (C) to the hydrogen ions ($H_3^+$) is lower than or equal to 3%.

According to one embodiment of the invention to be disclosed, the ion beam is an ion beam in which a proportion of carbon (C) to the hydrogen ions ($H_3^+$) is lower than or equal to 0.3%.

According to one embodiment of the invention to be disclosed, by the irradiation with the ion beam in which the proportion of $H_2O^+$ to hydrogen ions ($H_3^+$) is lower than or equal to 3%, preferably lower than or equal to 0.3%, addition of oxygen or a compound containing oxygen, as well as hydrogen ions, to the semiconductor substrate can be suppressed.

Addition of oxygen or a compound containing oxygen, as well as hydrogen ions, to the semiconductor substrate is suppressed, whereby a semiconductor layer with fewer defects can be obtained.

With use of the semiconductor layer with fewer defects, a highly reliable semiconductor device can be obtained.

Furthermore, by the irradiation with the ion beam in which the proportion of carbon (C) to the hydrogen ions ($H_3^+$) is lower than or equal to 3%, preferably lower than or equal to 0.3%, addition of carbon or a compound containing carbon, as well as hydrogen ions, to the semiconductor substrate can be suppressed. Carbon causes generation of defects in the semiconductor layer. Thus, addition of carbon or a compound containing carbon to the semiconductor substrate is suppressed, whereby a semiconductor layer with fewer defects can be obtained. Further, with use of the semiconductor layer with fewer defects, a high reliable semiconductor device can be manufactured.

In order to obtain the above ion beam, for example, a chamber of an ion doping apparatus may be heated before the semiconductor substrate is set in the ion doping apparatus, so that moisture or carbon inclusion attached on a surface of the chamber is removed.

Further, a filter with which moisture or carbon inclusion can be removed may be set inside the ion doping apparatus, so that moisture or carbon inclusion is removed before irradiation with the ion beam.

Further, in the case where a SUS (stainless steel) member is used for the chamber, the outermost surface of the chamber is made to be a chromium (Cr)-rich surface or a chromium oxide ($Cr_2O_3$) film is formed on the outermost surface of the chamber, whereby adsorption of moisture on the surface of the chamber can be reduced. With the above method, removal of moisture or carbon inclusion by heating the chamber or using a filter can be efficiently performed.

In general, the term "SOI substrate" means a semiconductor substrate in which a silicon layer is provided over an insulating surface. In this specification and the like, the term "SOI substrate" also includes a semiconductor substrate in which a semiconductor layer formed using a material other than silicon is provided over an insulating surface in its category. That is, a semiconductor layer included in the "SOI substrate" is not limited to a silicon layer. In addition, in this specification and the like, a semiconductor substrate means not only a substrate formed using only a semiconductor material but also all substrates including a semiconductor material. Namely, in this specification and the like, the "SOI substrate" is also included in the category of a semiconductor substrate.

Note that in this specification and the like, the term "single crystal" means a crystal in which, when a certain crystal axis is focused, the crystal axis is oriented in a direction similar to that of another crystal in any portion of a sample. That is, the single crystal includes in its category, a crystal whose crystal axis is aligned with that of adjacent crystals, as described above, even when there is a crystal defect or a dangling bond.

Further, in this specification and the like, the term "semiconductor device" means all devices which can operate by utilizing semiconductor characteristics. For example, a display device and an integrated circuit are included in the category of the semiconductor device. Furthermore, in this specification and the like, the display device includes a light-emitting display device, a liquid crystal display device, and a display device including an electrophoretic element. A light-emitting device includes a light-emitting element, and a liquid crystal display device includes a liquid crystal element. A light-emitting element includes, in its scope, an element whose luminance is controlled by a current or a voltage, and specifically includes an inorganic electroluminescence (EL) element, an organic EL element, and the like.

Note that the ordinal numbers such as "first", "second", and "third" in this specification are used for convenience and do not denote the order of steps and the stacking order of layers. In addition, the ordinal numbers in this specification do not denote particular names which specify the present invention.

According to one embodiment of the invention to be disclosed, a semiconductor layer with fewer defects can be obtained.

According to one embodiment of the invention to be disclosed, a highly reliable semiconductor device can be manufactured.

BRIEF DESCRIPTION OF THE DRAWINGS

FIG. 3 is a graph showing mass spectra of ion beams.

DETAILED DESCRIPTION OF THE INVENTION

Figure 1A:
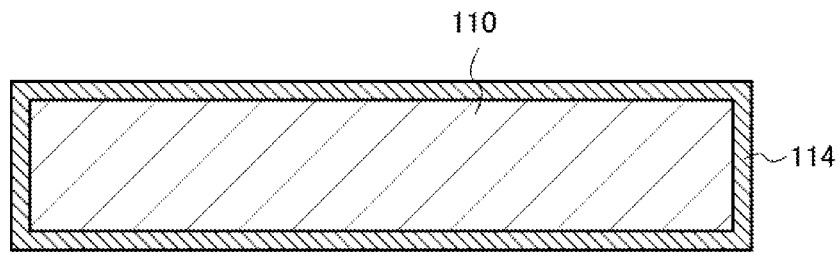
FIGS. 1A to 1C are cross-sectional views illustrating a manufacturing method of an SOI substrate.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to description of the embodiments. Note that, in the drawings hereinafter shown, the same portions or portions having similar functions are denoted by the same reference numerals, and repeated description thereof will be omitted.

Embodiment 1

First, as a bond substrate, a semiconductor substrate 110 is prepared. As the semiconductor substrate 110, a polycrystalline semiconductor substrate or a single crystal semiconductor substrate can be used. As the semiconductor substrate 110, for example, a semiconductor substrate that is formed using an element which belongs to Group 14, such as a polycrystalline or single crystal silicon substrate, a polycrystalline or single germanium substrate, a polycrystalline or single silicon germanium substrate, or a polycrystalline or single silicon carbide substrate, or a polycrystalline or single compound semiconductor substrate using gallium arsenide, indium phosphide, or the like can be given. A typical silicon substrate is a circular substrate having a size of 5 inches (125 mm) in diameter, 6 inches (150 mm) in diameter, 8 inches (200 mm) in diameter, and 12 inches (300 mm) in diameter. Note that the shape of a silicon substrate is not limited to the circular shape, and a silicon substrate processed to have a rectangular shape or the like can also be used. Note that unless otherwise specified, a square is also included as a rectangle. The case where a single crystal silicon substrate (silicon wafer) processed to have a rectangular shape is used as the semiconductor substrate 110 will be described below.

Further, a base substrate 100 is prepared separately. As the base substrate 100, a light-transmitting glass substrate used for a liquid crystal display device or the like can be used. As the glass substrate, the one whose strain point is 600° C. or higher is preferably used. Further, it is preferable that the glass substrate be a non-alkali glass substrate. As a material of the non-alkali glass substrate, a glass material such as aluminosilicate glass, aluminoborosilicate glass, or barium borosilicate glass is used, for example. When a glass substrate that can have a large size and is inexpensive is used as the base substrate 100, cost reduction can be achieved as compared with the case where a silicon substrate is used.

As the base substrate 100, a substrate which is formed of an insulator, such as a ceramic substrate, a quartz substrate, or a sapphire substrate; a substrate which is formed of a semiconductor such as silicon, a substrate which is formed of a conductor such as metal or stainless steel, or the like can be used. Furthermore, as the base substrate 100, a plastic substrate having heat resistance which can withstand process temperature in a manufacturing process may also be used. The case where a glass substrate processed to have a rectangular shape is used as the base substrate 100 will be described below.

Over the base substrate 100, an insulating layer 101 is formed. There is no particular limitation on the formation method of the insulating layer 101; a sputtering method, a plasma CVD method, or the like can be applied, for example. Since the insulating layer 101 has a surface for the bond, the insulating layer 101 is preferably formed such that this surface has high planarity. The insulating layer 101 can be formed using one or more materials selected from silicon oxide, silicon nitride, silicon oxynitride, silicon nitride oxide, aluminum oxide, aluminum nitride, aluminum oxynitride, aluminum nitride oxide, and the like. For example, when silicon oxide is used for the insulating layer 101, formation using an organosilane gas by a chemical vapor deposition method enables the insulating layer 101 to have excellent planarity. Note that although the insulating layer 101 has a single-layer structure in this embodiment, it may have a stack structure. A structure in which the insulating layer 101 is not provided may be employed as long as a problem does not particularly occur in bonding.

Next, an insulating layer 114 is formed on the semiconductor substrate 110 (see FIG. 1A).

As the insulating layer 114, a single layer of a silicon oxide layer, a silicon oxynitride layer, a silicon nitride layer, a silicon nitride oxide layer, or the like or a stack of these layers can be used. These layers can be formed by a CVD method, a sputtering method, or the like. In the case where the insulating layer 114 is formed by a CVD method, a silicon oxide layer formed using organosilane such as tetraethylorthosilicate (abbreviation: TEOS, chemical formula: $Si(OC_2H_5)_4$) is preferably used as the insulating layer 114 in terms of productivity.

Note that a silicon oxynitride layer refers to a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide layer refers to a layer which contains more nitrogen than oxygen, and in the case where measurements are performed using RBS and HFS, includes oxygen, nitrogen, silicon, and hydrogen at concentrations ranging from 5 at. % to 30 at. %, 20 at. % to 50 at. %, 25 at. % to 35 at. %, and 15 at. % to 25 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

Alternatively, the insulating layer 114 may be formed by performing thermal oxidation treatment on the semiconductor substrate 110. In this case, the thermal oxidation treatment is preferably performed in an oxidation atmosphere to which halogen is added. As an example of such thermal oxidation treatment, it is preferable that thermal oxidation treatment be performed in an atmosphere containing hydrogen chloride (HCl) at 0.5 vol. % to 10 vol. % (preferably, 3 vol. %) with respect to oxygen, at a temperature of 900° C. to 1150° C. (for example, 950° C.). Processing time may be set for 0.1 to 6 hours, preferably 0.5 to 1 hour. The thickness of an oxide layer to be formed is set to be 10 nm to 1000 nm (preferably, 50 nm to 200 nm), for example, 100 nm.

In this embodiment, by subjecting the semiconductor substrate 110 to thermal oxidation treatment in an atmosphere containing hydrogen chloride (HCl), the insulating layer 114 (here, a silicon oxide layer) is formed. Accordingly, the insulating layer 114 includes chlorine atoms.

Although the insulating layer 114 is formed on an entire surface of the semiconductor substrate 110 in this embodiment, the insulating layer 114 may be formed only on a surface to which the base substrate 100 is bonded (i.e., a surface subjected to irradiation with hydrogen ions in the later step). Further, when the insulating layer 114 is not necessarily provided, for example, when a problem does not occur in bonding, a structure in which the insulating layer 114 is not provided may be employed.

Figure 1B:
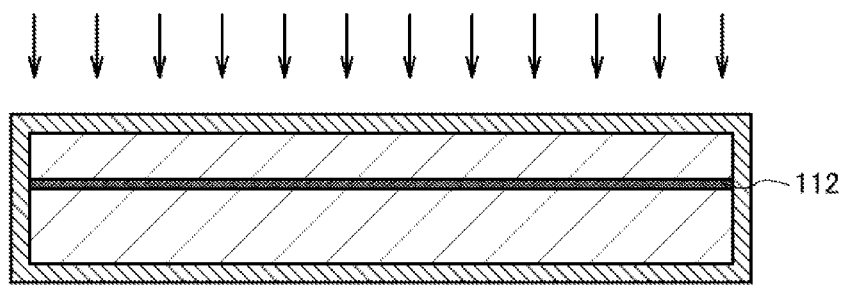

Then, the semiconductor substrate 110 on which the insulating layer 114 is formed is irradiated with the hydrogen ions. Thus, an embrittled region 112 is formed in the semiconductor substrate 110 (see FIG. 1B).

When the semiconductor substrate 110 is irradiated with the hydrogen ions, an ion doping apparatus is used. In an ion doping apparatus, a process gas is excited to produce ion species, and a process object is irradiated with the produced ion species without mass separation.

In the case of using the ion doping apparatus, a gas containing hydrogen, e.g., a 100% hydrogen gas, is used as a source gas. By using the gas containing hydrogen, $H^+$, $H_2^+$, and $H_3^+$ ions can be produced as ion species. In the case where the gas containing hydrogen is used as a source gas, it is preferable to perform irradiation with a larger amount of $H_3^+$ ions. Specifically, $H_3^+$ ions are preferably contained at higher than or equal to 70% of the total amount of $H^+$, $H_2^+$, and $H_3^+$ ions in the ion beam. It is more preferable that the proportion of $H_3^+$ ions be higher than or equal to 80%. By increasing the proportion of $H_3^+$ ions in this manner, the embrittled region 112 can contain hydrogen at a concentration higher than or equal to $1 \times 10^{21}$ atoms/cm$^3$. This is because separation at the embrittled region 112 can be easily performed. Furthermore, by the irradiation with a large amount of $H_3^+$ ions, the embrittled region 112 can be formed in a shorter period of time as compared with the case of irradiation with $H^+$ ions and $H_2^+$ ions. Moreover, with use of $H_3^+$ ions, the average penetration depth of the hydrogen ions can be made shallower; thus, the embrittled region 112 can be formed at a shallower region.

On a surface of a member which is part of the ion doping apparatus and provided inside the ion doping apparatus, moisture which cannot be completely removed is attached. The moisture is vaporized and ionized at the time of irradiation with the hydrogen ions and mixed into the gas containing hydrogen. Therefore, oxygen derived from moisture attached inside the ion doping apparatus or the like might be added to the semiconductor substrate 110, concurrently with irradiation with the hydrogen ions.

Oxygen added concurrently with irradiation with the hydrogen ions enters a crystal in the semiconductor substrate 110 and causes crystal defects such as dislocation or generation of oxide precipitate. If a semiconductor layer is separated from the semiconductor substrate 110 in which dislocation or defects are generated due to oxygen atoms entered in the crystal, an SOI substrate to be manufactured might have crystal defects such as dislocation or oxide precipitate.

Further, in the case where the semiconductor substrate 110 from which the semiconductor layer has been separated is repeatedly reused for obtaining a semiconductor layer, if dislocation or crystal defects is/are left in the semiconductor substrate 110, an SOI substrate to be manufactured might also have crystal defects such as dislocation.

Thus, in the ion beam including the hydrogen ions, the proportion of $H_2O^+$ to the hydrogen ions ($H_3^+$) is preferably lower than or equal to 3%, further preferably lower than or equal to 0.3%. When irradiation with the hydrogen ions is performed by using an ion beam with low oxygen concentration as described above, addition of oxygen atoms into the semiconductor substrate 110 can be suppressed. By suppressing addition of oxygen atoms in the semiconductor substrate 110, generation of dislocation or defects in the semiconductor layer separated from such a semiconductor substrate 110 can be suppressed.

Further, when carbon (C) enters a crystal in the semiconductor substrate 110, dislocation or defects is/are caused as in the case of entry of oxygen. Thus, the proportion of carbon (C) to the hydrogen ions ($H_3^+$) in the ion beam is preferably lower than or equal to 3%, further preferably lower than or equal to 0.3%.

In order to obtain the ion beam, for example, a chamber of an ion doping apparatus may be heated before the semiconductor substrate 110 is set in the ion doping apparatus, so that moisture or carbon inclusion attached on a surface of the chamber is removed.

Alternatively, a filter with which moisture or carbon inclusion can be removed may be set inside the ion doping apparatus, so that moisture or carbon inclusion is removed before irradiation with an ion beam Further, in the case where a SUS (stainless steel) member is used for the chamber, the outermost surface of the chamber is made to be a chromium (Cr)-rich surface or a chromium oxide ($Cr_2O_3$) film is formed on the outermost surface of the chamber, whereby adsorption of moisture on the surface of the chamber can be reduced. With the above method, removal of moisture or carbon inclusion by heating the chamber or using a filter can be efficiently performed.

As described above, the semiconductor substrate 110 is irradiated with the ion beam including the accelerated hydrogen ions, so that the embrittled region 112 is formed at a predetermined depth from the surface of the semiconductor substrate 110. The depth of the region where the embrittled region 112 is formed can be controlled by the acceleration energy of the ion beam and the incidence angle thereof. In other words, the embrittled region 112 is formed in a region at a depth the same or substantially the same as the average penetration depth of the hydrogen ions. Here, the depth at which the embrittled region 112 is formed is preferably uniform over the entire area of the semiconductor substrate 110.

Further, the depth at which the above-described embrittled region 112 is formed determines the thickness of the semiconductor layer which is to be separated from the semiconductor substrate 110. The depth at which the embrittled region 112 is formed is greater than or equal to 50 nm and less than or equal to 1 µm, preferably greater than or equal to 50 nm and less than or equal to 300 nm from the surface of the semiconductor substrate 110.

In the case of using an ion doping apparatus, a process for forming the embrittled region 112 can be performed, for example, under the following conditions.

The acceleration voltage is higher than or equal to 10 kV and lower than or equal to 100 kV (preferably higher than or equal to 30 kV and lower than or equal to 80 kV).

The dose is greater than or equal to $1\times10^{16}$ ions/cm$^2$ and less than or equal to $4\times10^{16}$ ions/cm$^2$.

The beam current density is higher than or equal to 2 µA/cm$^2$ (preferably, higher than or equal to 5 µA/cm$^2$, and further preferably, higher than or equal to 10 µA/cm$^2$).

Figure 1C:
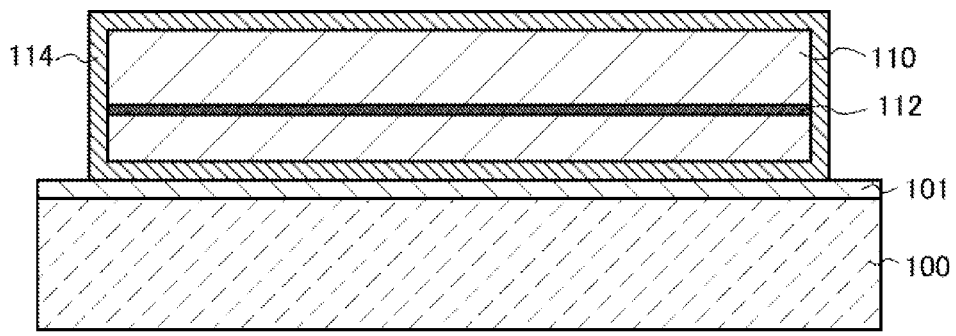

Next, the base substrate 100 and the semiconductor substrate 110 are bonded to each other (see FIG. 1C). Specifically, the surface of the base substrate 100 faces the surface of the semiconductor substrate 110, and the insulating layer 101 formed over the base substrate 100 and the insulating layer 114 formed on the semiconductor substrate 110 are bonded to each other.

Note that before the base substrate 110 and the semiconductor substrate 100 are bonded to each other, at least one of the base substrate 100 and the insulating layer 114 formed on the semiconductor substrate 110 is preferably subjected to surface treatment. By performing surface treatment, the bonding strength at the bonding interface between the semiconductor substrate 110 and the base substrate 100 can be improved. Moreover, surface treatment enables a reduction in particles (also referred to as dust) or the like on the substrate, so that bonding defects due to the particles or the like can be suppressed.

As examples of the surface treatment, a wet treatment, a dry treatment, and a combination of both are given. Alternatively, a combination of different wet treatments or a combination of different dry treatments may be employed.

When one of the base substrate 100 and the semiconductor substrate 110, or both of them are heated in the case of bonding the base substrate 100 and the semiconductor substrate 110, defects due to the interface between the base substrate 100 and the semiconductor substrate 110, which is formed in bonding, can be reduced. In the case of heating the base substrate 100, the heating temperature of the base substrate 100 is higher than or equal to 50° C. and lower than or equal to 100° C., preferably, higher than or equal to 55° C. and lower than or equal to 95° C. There is no particular limitation on the heating time, which is set as appropriate so that the base substrate 100 reaches a desired temperature. For example, the base substrate 100 can be heated for 180 seconds.

Next, the base substrate IOU heated to a desired temperature is pressed, whereby an end portion of the base substrate 100 is in contact with an end portion of the semiconductor substrate 110. Alternatively, with use of a pin or the like, a point of the base substrate 100 or the semiconductor substrate 110, for example, a central portion of the base substrate 100 is pressed, whereby the base substrate 100 may be in contact with the semiconductor substrate 110. The base substrate 100 and the semiconductor substrate 110 start to be bonded to each other from a portion where they are in contact with each other, and the bonding extends in a concentric pattern from the start point. For example, when the bonding starts from one of the corner portions of the base substrate 100 and the semiconductor substrate 110, the bonding extends in a concentric pattern toward the opposite corner of the corner portion, which forms a bonding over the entire surface.

Next, after the semiconductor substrate 110 and the base substrate 100 are bonded to each other, the semiconductor substrate 110 and the base substrate 100 are preferably subjected to heat treatment so that the bonding is strengthened. The heat temperature at this time is preferably a temperature that does not promote separation at the embrittled region 112. For example, the temperature is set to lower than 400° C., preferably lower than or equal to 300° C. Heat treatment time is not particularly limited and may be optimally set as appropriate depending on the relation between processing time and bonding strength. The heat treatment can be performed using a diffusion furnace, a heating furnace such as a resistance heating furnace, a rapid thermal annealing (RTA) apparatus, or the like. Further, only the region for bonding can be locally heated by irradiation with microwaves or the like. When the substrates have no bonding strength problems, the heat treatment may be omitted. Note that in this embodiment, heat treatment is performed at 200° C. for two hours.

Figure 2A:
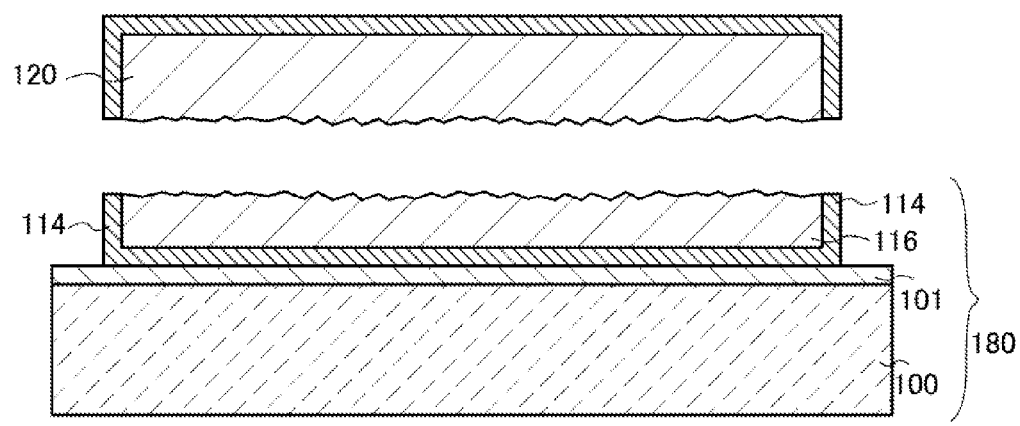
FIGS. 2A and 2B are cross-sectional views illustrating a manufacturing method of an SOI substrate.

Next, by performing the heat treatment, the semiconductor substrate 110 is divided into a semiconductor layer 116 and a semiconductor substrate 120 along the embrittled region 112 (see FIG. 2A). Through the above steps, an SOI substrate 180 in which the semiconductor layer 116 is provided over the base substrate 100 with the insulating layer 114 interposed therebetween can be obtained.

When the heat treatment is performed, the hydrogen atom added is separated out into microvoids which are formed in the embrittled region 112 by increase in temperature, and internal pressure of the microvoids is increased. An increase in the pressure causes a change in volume of the microvoids in the embrittled region 112, and microbubbles of hydrogen grow.

The grown microbubbles form a microbubble layer, and part of the semiconductor substrate 110 is separated from the semiconductor substrate 110 along the microbubble layer. Since the insulating layer 114 and the base substrate 100 are bonded to each other, the semiconductor layer 116 which is separated from the semiconductor substrate 110 is formed over the base substrate 100 with the insulating layer 114 interposed therebetween. This heat treatment is performed at a temperature not exceeding the strain point of the base substrate 100. In the case of using a glass substrate as the base substrate 100, for example, heat treatment temperature is preferably set to be higher than or equal to 400° C. and lower than or equal to 750° C. However, a glass substrate is not limited thereto as long as the glass substrate can withstand heat. For this heat treatment, a diffusion furnace, a heating furnace such as a resistance heating furnace, a rapid thermal annealing (RTA) apparatus, a microwave heating apparatus, or the like can be used. Note that in this embodiment, the heat treatment is performed at 600° C. for two hours.

Note that without performing the above-described heat treatment for increasing the bonding strength between the base substrate 100 and the semiconductor substrate 110, a heat treatment step for increasing the bonding strength between the base substrate 100 and the insulating layer 114 and a heat treatment step for separation along the embrittled region 112 may be performed at the same time.

Then, if necessary, planarization treatment is performed on the semiconductor layer 116 of the SOI substrate 180. Even when unevenness or a defect due to the separation step or the ion irradiation step is caused on the surface of the semiconductor layer 116, by performing planarization treatment on the SOI substrate 180, the surface of the semiconductor layer 116 can be planarized.

For the planarization treatment, chemical mechanical polishing (CMP) treatment, etching treatment, irradiation with laser light, or the like can be performed. Here, by irradiation of the semiconductor layer 116 with laser light, the semiconductor layer 116 is recrystallized and its surface is planarized.

As described above, the surface unevenness of part of the semiconductor substrate 110 (the semiconductor layer) can be reduced in this embodiment; thus, generation of voids in the surface of the semiconductor layer can be prevented even when the semiconductor layer 116 is irradiated with laser light.

By irradiation with laser light through the top surface of the semiconductor layer 116, the top surface of the semiconductor layer 116 is melted. After being melted, the semiconductor layer 116 is cooled and solidified, so that a semiconductor layer 118 having the top surface whose flatness is improved can be obtained. By using laser light, the base substrate 100 is not directly heated, and the temperature rise of the base substrate 100 can be suppressed. Therefore, a low-heat-resistant substrate such as a glass substrate can be used as the base substrate 100.

Note that it is preferable that the semiconductor layer 116 be partially melted by laser light irradiation. This is because, if the semiconductor layer 116 is completely melted, it is microcrystallized due to disordered nucleation after being in a liquid phase, so that crystallinity thereof is highly likely to decrease. On the other hand, by partial melting, crystal growth proceeds from a non-melted solid phase part. Accordingly, defects in the semiconductor layer 116 can be reduced. Note that "complete melting" herein means that the semiconductor layer 116 is melted into a liquid state down to the vicinity of its lower interface. On the other hand, in this case, the term "partial melting" means that the upper part of the semiconductor layer 116 is melted and is in a liquid phase while the lower part thereof is not melted and is still in a solid phase.

A pulsed laser is preferably used for the laser irradiation. This is because high-energy pulsed laser light can be emitted instantaneously and the partial melting state can be easily obtained. The repetition rate is preferably about from 1 Hz to 10 MHz, inclusive.

After the above-described laser irradiation, a process of reducing the thickness of the semiconductor layer 118 may be performed. The semiconductor layer 118 may be thinned by etching treatment (etch-back treatment) by either dry etching or wet etching or a combination of both. For example, in the case where the semiconductor layer 118 is formed using a silicon material, the semiconductor layer 118 can be thinned by dry etching using $SF_6$ and $O_2$ as a process gas.

Note that planarization treatment may also be performed on the semiconductor substrate 120 which has been separated, in addition to the SOI substrate 180. By planarizing the surface of the semiconductor substrate 120 which has been separated, the semiconductor substrate 120 can be reused in a process of manufacturing an SOI substrate.

Figure 2B:
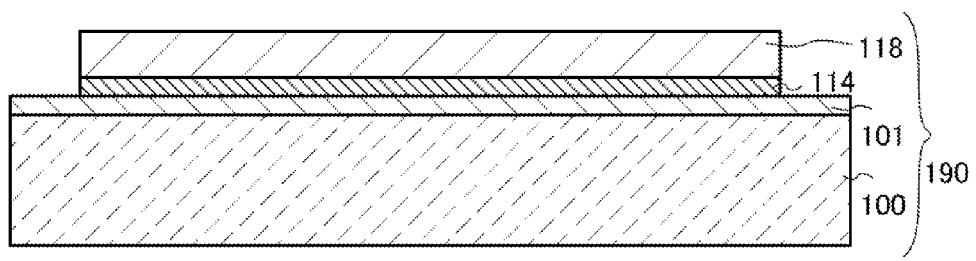

Through the above process, an SOI substrate 190 in which the semiconductor layer 118 is provided over the base substrate 100 with the insulating layer 114 interposed therebetween can be manufactured (see FIG. 2B).

Note that although the case where the etching treatment is performed after the semiconductor layer 116 is irradiated with laser light is described in this embodiment, one embodiment of the disclosed invention is not limited thereto; the etching treatment may be performed before the laser light irradiation, or both before and after the laser light irradiation.

Note that although laser light is used to achieve a reduction in defects and an improvement in the planarity in this embodiment, one embodiment of the disclosed invention is not limited thereto. A reduction in defects and an improvement in planarity may be achieved with use of another method such as heat treatment. Even when defects are reduced and the planarity is improved by performing the heat treatment, it is effective to reduce bonding defects caused by surplus moisture by performing heat treatment on at least one of the base substrate 100 and the semiconductor substrate 110 before the bonding. Further, only treatment for improving planarity, such as etching treatment, may be performed if treatment for reducing defects is unnecessary.

According to this embodiment as described above, a semiconductor layer with fewer defects can be obtained.

Embodiment 2

Figure 6A:
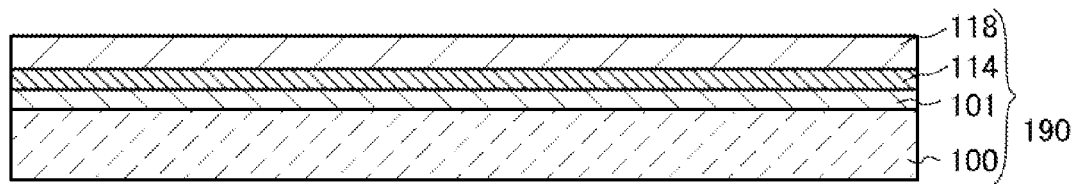
FIGS. 6A to 6D are cross-sectional views illustrating a manufacturing process of a semiconductor device.

FIG. 6A is a cross-sectional view illustrating part of the SOI substrate (see FIG. 2B) manufactured with the method described in Embodiment 1.

In order to control the threshold voltage of a thin film transistor (TFT), a p-type impurity element such as boron, aluminum, or gallium, or an n-type impurity element such as phosphorus or arsenic may be added to the semiconductor layer 118. A region to which the impurity element is added and the kind of impurity element to be added can be changed as appropriate. For example, a p-type impurity element is added to a formation region of an n-channel TFT, and an n-type impurity element is added to a formation region of a p-channel TFT. The above impurity element may be added at a dose greater than or equal to $1 \times 10^{11}$ ions/cm$^2$ to $1 \times 10^{14}$ ions/cm$^2$.

Figure 6B:
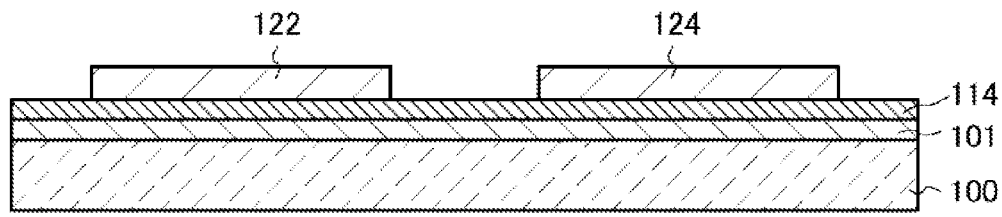

Then, the semiconductor layer 118 is separated into island shapes, whereby semiconductor layers 122 and 124 are formed (see FIG. 6B).

Figure 6C:
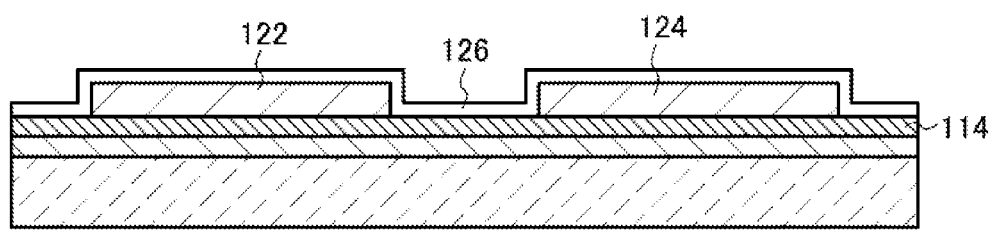

Next, an insulating film 126 is formed to cover the semiconductor layer 122 and the semiconductor layer 124 (see FIG. 6C). Here, a single layer of a silicon oxide film is formed by a plasma CVD method. Alternatively, a film containing silicon oxynitride, silicon nitride oxide, silicon nitride, hafnium oxide, aluminum oxide, tantalum oxide, or the like may be formed to have a single-layer structure or a stacked structure as the gate insulating film 126, besides a silicon oxide film.

As a manufacturing method other than a plasma CVD method, a sputtering method or a method using oxidation or nitridation by high density plasma treatment can be given. High-density plasma treatment is performed using, for example, a mixed gas of a rare gas such as helium, argon, krypton, or xenon; and a gas such as oxygen, nitrogen oxide, ammonia, nitrogen, or hydrogen. In this case, by exciting plasma by introduction of microwaves, plasma with a low electron temperature and high density can be generated. The surfaces of the semiconductor layers are oxidized or nitrided by oxygen radicals (OH radicals may be included) or nitrogen radicals (NH radicals may be included) which are produced by such high-density plasma, whereby an insulating film is formed to a thickness greater than or equal to 1 nm and less than or equal to 20 nm, preferably greater than or equal to 2 nm and less than or equal to 10 nm so as to be in contact with the semiconductor layers.

Since the oxidation or nitridation of the semiconductor layers 122 and 124 performed by high-density plasma treatment is a solid phase reaction, the interface state density between the insulating film 126 and the semiconductor layer 122 and the interface state density between the insulating film 126 and the semiconductor layer 124 can be extremely low. Further, when the semiconductor layers 122 and 124 are directly oxidized or nitrided by the high-density plasma treatment, ununiformity in thickness of the insulating film 126 to be formed can be suppressed. Since the semiconductor layers 122 and 124 are single crystal films, even when the surfaces of the semiconductor layers 122 and 124 are oxidized by a solid-phase reaction by using the high-density plasma treatment, the insulating film 126 with high uniformity and low interface state density can be formed. When the insulating film 126 formed by high-density plasma treatment as described above is used for a part or whole of a gate insulating film of the transistor, variation in characteristics can be suppressed.

Alternatively, the gate insulating film may be formed by thermally oxidizing the semiconductor layers 122 and 124. In the case of such thermal oxidation, it is necessary to use a glass substrate having a certain degree of heat resistance.

Note that the insulating film 126 containing hydrogen is formed, and then heat treatment at a temperature higher than or equal to 350° C. and lower than or equal to 450° C. is performed thereon, whereby hydrogen contained in the insulating film 126 may be diffused into the semiconductor layers 122 and 124. In this case, the insulating film 126 can be formed using silicon nitride or silicon nitride oxide by a plasma CVD method. Further, a process temperature is preferably set to be equal to or lower than 350° C. In this manner, hydrogen is supplied to the semiconductor layers 122 and 124, whereby defects in the semiconductor layers 122 and 124, at an interface between the insulating film 126 to be the gate insulating film and the semiconductor layer 122, and at an interface between the insulating film 126 to be the gate insulating film and the semiconductor layer 124 can be effectively reduced.

Figure 6D:
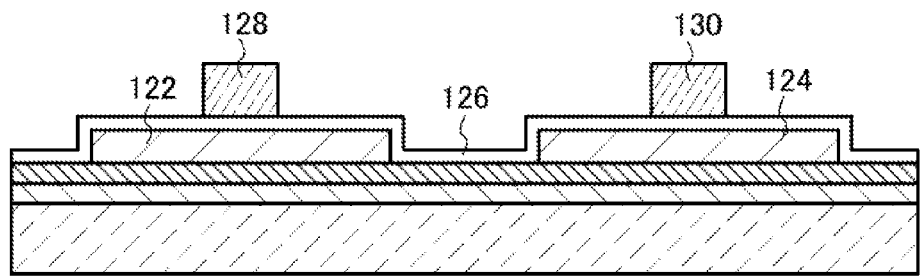

Next, a conductive film is formed over the gate insulating film 126, and then, the conductive film is processed (patterned) into a predetermined shape, whereby a gate electrode 128 and a gate electrode 130 are formed over the semiconductor layer 122 and the semiconductor layer 124, respectively (see FIG. 6D). The conductive film can be formed by a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as a main component or a compound containing the above-described metal can also be used. Further alternatively, a semiconductor material, such as polycrystalline silicon which is obtained by doping a semiconductor with an impurity element that imparts a conductivity type, may be used.

Although the gate electrodes 128 and 130 are formed using a single-layer conductive film in this embodiment, a semiconductor device according to one embodiment of the disclosed invention is not limited to this structure. The gate electrodes 128 and 130 may be formed of a plurality of conductive films which are stacked. In the case of a two-layer structure, for example, a molybdenum film, a titanium film, a titanium nitride film, or the like may be used as a lower layer, and an aluminum film or the like may be used as an upper layer. In the case of a three-layer structure, a stacked structure of a molybdenum film, an aluminum film, and a molybdenum film; a stacked structure of a titanium film, an aluminum film, and a titanium film; or the like may be used.

Note that a mask used for forming the gate electrodes 128 and 130 may be formed using a material such as silicon oxide or silicon nitride oxide. In this case, a step of forming a mask by patterning the silicon oxide film, the silicon nitride oxide film, or the like is additionally needed. With such a step, decrease in film thickness of the mask in etching is smaller than that in the case of using a resist material; thus, the gate electrodes 128 and 130 with more precise shapes can be formed. Alternatively, the gate electrodes 128 and 130 may be selectively formed by a droplet discharge method without using a mask. Here, a droplet discharge method refers to a method in which droplets containing a predetermined composition are discharged or ejected to form a predetermined pattern, and includes an ink-jet method and the like in its category.

Alternatively, the electrodes 128 and 130 can be formed by etching the conductive film to have desired tapered shapes by an inductively coupled plasma (ICP) etching method with appropriate adjustment of etching conditions (e.g., the amount of electric power applied to a coiled electrode, the amount of electric power applied to a substrate-side electrode, the temperature of the substrate-side electrode, and the like). The tapered shape can be adjusted in accordance with the shape of the mask. Note that as an etching gas, a chlorine-based gas such as chlorine, boron chloride, silicon chloride, or carbon tetrachloride, a fluorine-based gas such as carbon tetrafluoride, sulfur fluoride, or nitrogen fluoride, oxygen, or the like can be used as appropriate.

Figure 7A:
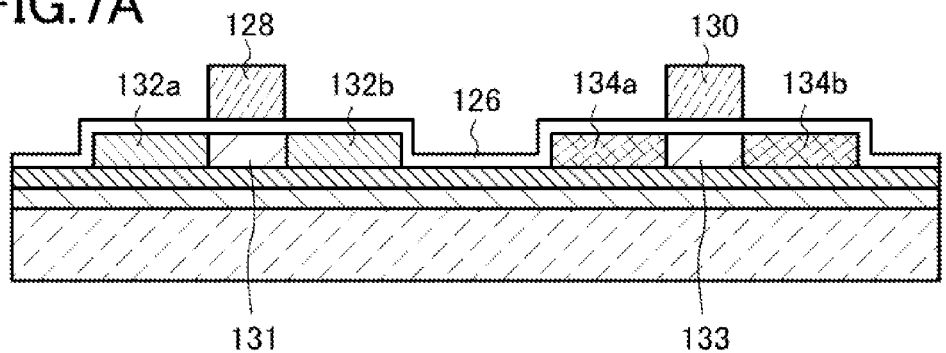
FIGS. 7A to 7D are cross-sectional views illustrating a manufacturing process of a semiconductor device.

Then, impurity elements each imparting one conductivity type are added into the semiconductor layers 122 and 124 using the gate electrodes 128 and 130 as masks (see FIG. 7A). In this embodiment, an impurity element imparting n-type conductivity (for example, phosphorus or arsenic) is added to the semiconductor layer 122, and an impurity element imparting p-type conductivity (for example, boron) is added to the semiconductor layer 124. Note that when the impurity element imparting n-type conductivity is added to the semiconductor layer 122, the semiconductor layer 124 to which the p-type impurity element is added is covered with a mask or the like so that the impurity element imparting n-type conductivity is added selectively. Further, when the impurity element imparting p-type conductivity is added to the semiconductor layer 124, the semiconductor layer 122 to which the impurity element imparting n-type conductivity is added is covered with a mask or the like so that the impurity element imparting p-type conductivity is added selectively. Alternatively, after one of the impurity element imparting p-type conductivity and the impurity element imparting n-type conductivity is added to the semiconductor layers 122 and 124, the other of the impurity element imparting p-type conductivity and the impurity element imparting n-type conductivity may be added to only one of the semiconductor layers at a higher concentration. By the addition of the impurity element, an impurity region 132a and an impurity region 132b are formed in the semiconductor layer 122, and an impurity region 134a and an impurity region 134b are formed in the semiconductor layer 124. In addition, a channel formation region 131 is formed between the impurity region 132a and the impurity region 132b, and a channel formation region 133 is formed between the impurity region 134a and the impurity region 134b.

Figure 7B:
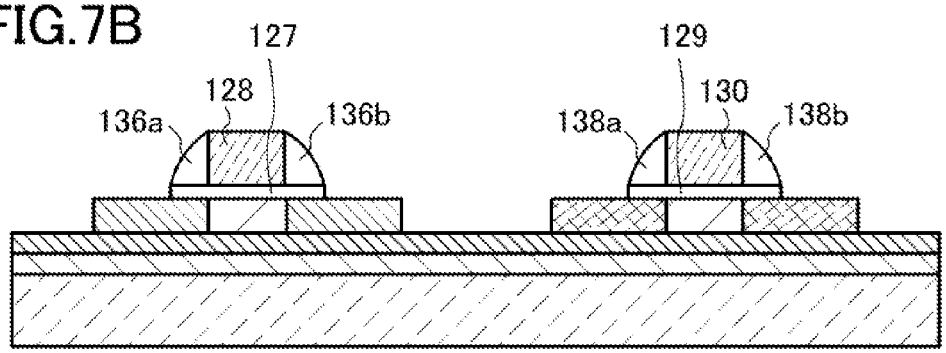

Then, a sidewall 136a and a sidewall 136b are formed on side surfaces of the gate electrode 128, and a sidewall 138a and a sidewall 138b are formed on side surfaces of the gate electrode 130 (see FIG. 7B). For example, an insulating film is formed to cover the insulating film 126, the gate electrode 128, and the gate electrode 130, and the insulating film is partly etched by anisotropic etching, so that the sidewalls 136a and 136b and the sidewalls 138a and 138b can be formed. Note that by the above anisotropic etching with use of the gate electrode 128 and the sidewalls 136a and 136b as masks, the insulating film 126 is partly etched, so that a gate insulating film 127 is formed. Similarly, by the above anisotropic etching with use of the gate electrode 130 and the sidewalls 138a and 138b as masks, the insulating film 126 is partly etched, so that a gate insulating film 129 is formed.

For the insulating film used for forming the sidewalls 136a and 136b and the sidewalls 138a and 138b, a film containing silicon, silicon oxide, silicon nitride, silicon oxynitride, silicon nitride oxide, an organic material, or the like may be formed to have a single-layer structure or a stacked structure by a plasma CVD method, a sputtering method, or the like. In this embodiment, a 100-nm-thick silicon oxide film is formed by a plasma CVD method. In addition, as an etching gas, a mixed gas of $CHF_3$ and helium can be used. Note that a formation step of the sidewalls 136a and 136b and the sidewalls 138a and 138b is not limited to the above.

Then, an impurity element imparting one conductivity is added to the semiconductor layer 122 with use of the gate insulating film 127, the gate electrode 128, and the sidewalls 136a and 136b as masks. Similarly, an impurity element imparting one conductivity is added to the semiconductor layer 124 with use of the gate insulating film 129, the gate electrode 130, and the sidewalls 138a and 138b as masks.

Note that the impurity elements imparting the same conductivity types as the impurity elements which have been added to the semiconductor layers 122 and 124 in the previous step are added to the semiconductor layers 122 and 124 at higher concentrations than those in the previous step. Here, when the impurity element imparting n-type conductivity is added to the semiconductor layer 122, the semiconductor layer 124 to which the p-type impurity element is added is covered with a mask or the like so that the impurity element imparting n-type conductivity is added selectively. Further, when the impurity element imparting p-type conductivity is added to the semiconductor layer 124, the semiconductor layer 122 to which the impurity element imparting n-type conductivity is added is covered with a mask or the like so that the impurity element imparting p-type conductivity is added selectively.

By the above addition of the impurity elements, a pair of high concentration impurity regions 140a and 140b, a pair of low concentration impurity regions 141a and 141b, and the channel formation region 131 are formed in the semiconductor layer 122. In addition, by the above addition of the impurity elements, a pair of high concentration impurity regions 142a and 142b, a pair of low concentration impurity regions 143a and 143b, and the channel formation region 133 are formed in the semiconductor layer 124. Each of the pair of high concentration impurity regions 140a and 140b and each of the pair of high concentration impurity regions 142a and 142b function as a source region or a drain region. The low concentration impurity regions 141a and 141b and the low concentration impurity regions 143a and 143b function as lightly doped drain (LDD) regions.

Note that the sidewalls 136a and 136b formed over the semiconductor layer 122 and the sidewalls 138a and 138b formed over the semiconductor layer 124 may be formed so as to have the same length in a direction where carriers move (a direction parallel to a so-called channel length), or may be formed so as to have different lengths. For example, the sidewalls 138a and 138b over the semiconductor layer 124 which constitutes a part of a p-channel transistor 152 is preferably formed to have a longer length in the direction where carriers move than the sidewalls 136a and 136b over the semiconductor layer 122 which constitutes a part of an n-channel transistor 151. By increasing the lengths of the sidewalls 138a and 138b of the p-channel transistor 152, a short channel effect due to diffusion of boron can be suppressed; therefore, boron can be added to the source region and the drain region at high concentration. Accordingly, the resistance of the source region and the drain region can be sufficiently reduced.

Silicide regions in which silicide are formed in part of the semiconductor layers 122 and 124 may be formed in order to further reduce the resistance of the source region and the drain region. The silicide is formed by placing a metal in contact with the semiconductor layers and causing a reaction between the metal and silicon in the semiconductor layers by heat treatment (e.g., a GRTA method, an LRTA method, or the like). For the silicide region, cobalt silicide, nickel silicide, or the like may be used. In the case where the semiconductor layers 122 and 124 are thin, silicide reaction may proceed to bottoms of the semiconductor layers 122 and 124. As a metal material used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Alternatively, a silicide region can also be formed by laser beam irradiation or the like.

Figure 7C:
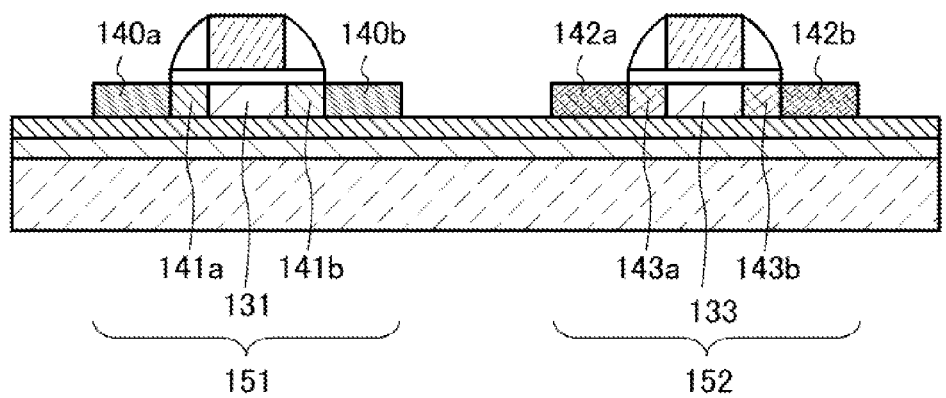

Through the aforementioned steps, the n-channel transistor 151 and the p-channel transistor 152 are formed. Note that although a conductive film serving as a source electrode or a drain electrode has not been formed at the stage in FIG. 7C, a structure including the conductive film serving as a source electrode or a drain electrode may also be referred to as a transistor.

Next, an insulating film 145 is formed to cover the n-channel transistor 151 and a p-channel transistor 152. The insulating film 145 is not necessarily provided; however, formation of the insulating film 145 can prevent impurities such as an alkali metal or an alkaline-earth metal from entering the n-channel transistor 151 and the p-channel transistor 152. Specifically, the insulating film 145 is preferably formed using a material such as silicon oxide, silicon nitride, silicon oxynitride, silicon nitride oxide, aluminum nitride, aluminum oxide, or the like. In this embodiment, a silicon nitride oxide film with a thickness of approximately 600 nm is used as the insulating film 145. In this case, the above-described hydrogenation step may be performed after the silicon nitride oxide film is formed. Note that although the insulating film 145 has a single-layer structure in this embodiment, it is needless to say that the insulating film 145 may have a stacked structure. For example, in the case of a two-layer structure, the insulating film 145 may have a stacked structure of a silicon oxynitride film and a silicon nitride oxide film.

Figure 7D:
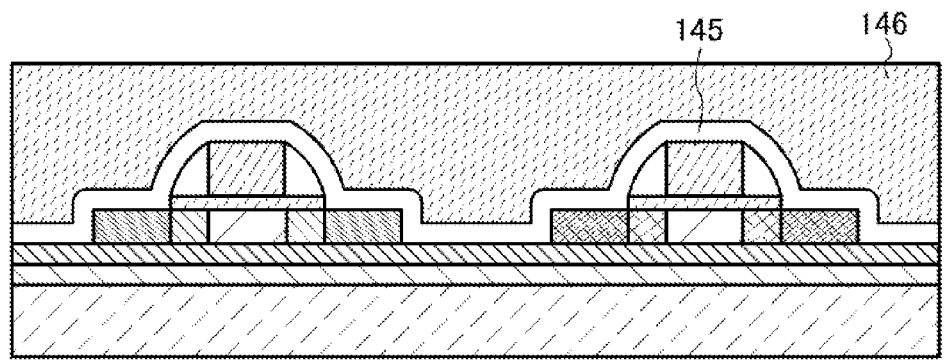

Next, an insulating film 146 is formed over the insulating film 145 to cover the n-channel transistor 151 and the p-channel transistor 152 (see FIG. 7D). The insulating film 146 may be formed using an organic material having heat resistance, such as polyimide, acrylic, benzocyclobutene, polyamide, or epoxy. Other than such an organic material, it is also possible to use a low-dielectric constant material (a low-k material), a siloxane based resin, silicon oxide, silicon nitride, silicon oxynitride, silicon nitride oxide, phosphosilicate glass (PSG), borophosphosilicate glass (BPSG), alumina, or the like. Here, the siloxane-based resin corresponds to a resin including a Si—O—Si bond which is formed using a siloxane-based material as a starting material. The siloxane-based resin may include, besides hydrogen, at least one of fluorine, an alkyl group, or aromatic hydrocarbon as a substituent. Note that insulating films formed of these materials may be stacked to form the insulating film 146.

Depending on the material, the insulating film 146 can be formed by a sputtering method, a CVD method, an SOG method, a spin coating method, a dip coating method, a spray coating method, or a droplet discharging method (e.g., an inkjet method), a printing method (e.g., screen printing or offset printing), or with a tool (equipment) such as a doctor knife, a roll coater, a curtain coater, or a knife coater.

Figure 8:
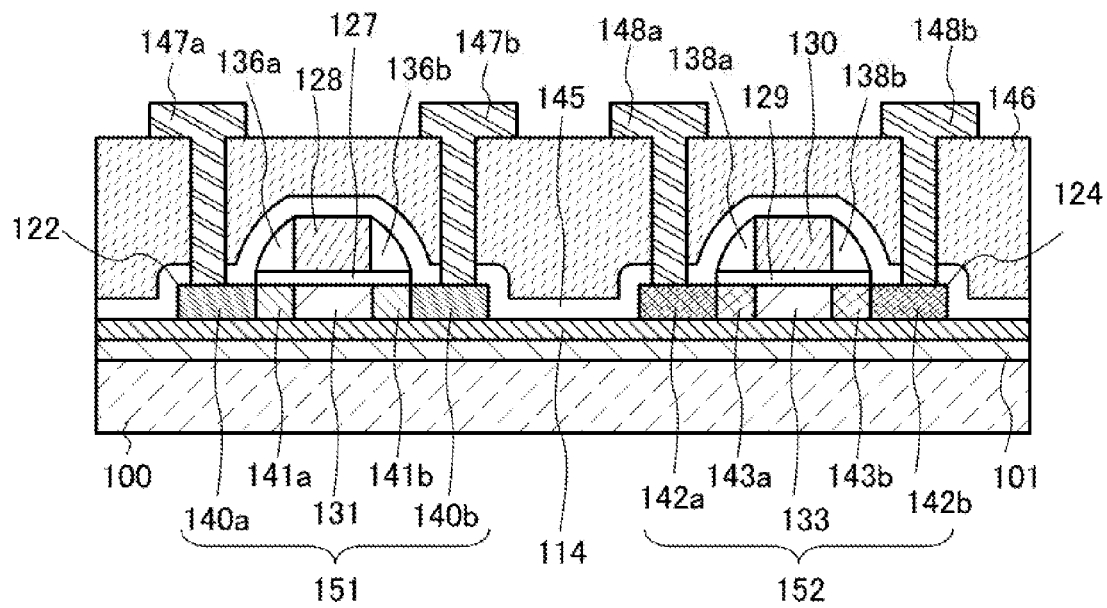
FIG. 8 is a cross-sectional view illustrating a manufacturing process of a semiconductor device.

Next, contact holes are formed in the insulating films 145 and 146 so that each of the semiconductor layers 122 and 124 is partly exposed. Then, a conductive film 147a and a conductive film 147b which are in contact with the semiconductor layer 122 through some of the contact holes and a conductive film 148a and a conductive film 148b which are in contact with the semiconductor layer 124 through some of the contact holes are formed (see FIG. 8). Each of the conductive films 147a and 147b and each of the conductive films 148a and 148b function as a source electrode or a drain electrode of the transistor. Note that in this embodiment, as an etching gas for forming the contact holes, a mixed gas of $CHF_3$ and He is employed; however, the etching gas is not limited thereto.

The conductive films 147a, 147b, 148a, and 148b can be formed by a CVD method, a sputtering method, or the like. As a material of the conductive films, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described material as its main component or a compound containing the above-described material may be used. Each of the conductive films 147a, 147b, 148a, and 148b may have a single-layer structure or a stacked structure.

As an example of an alloy containing aluminum as its main component, an alloy containing aluminum as its main component and also containing nickel can be given. In addition, an alloy containing aluminum as its main component and also containing nickel and one of carbon and silicon or the both can also be given as an example thereof. Aluminum and aluminum silicon (Al—Si), which have low resistance and are inexpensive, are suitable as a material for forming the conductive films 147a, 147b, 148a, and 148b. In particular, aluminum silicon is preferable because generation of a hillock caused by resist baking for processing aluminum silicon into a desired shape can be suppressed. Further, a material in which copper (Cu) is mixed into aluminum at approximately 0.5% may be used instead of silicon.

In the case where each of the conductive films 147a, 147b, 148a, and 148b is formed to have a stacked structure, a stacked structure of a barrier film, an aluminum silicon film, and a barrier film, a stacked structure of a barrier film, an aluminum silicon film, a titanium nitride film, and a barrier film, or the like may be employed, for example. Note that the barrier film is a film formed of titanium, titanium nitride, molybdenum, molybdenum nitride, tantalum, tantalum nitride, or the like. By forming the conductive films such that an aluminum silicon film is interposed between barrier films, generation of hillocks of aluminum or aluminum silicon can be further prevented. Further, when the barrier film is formed using titanium that is an element having a high reducing property, even if a thin native oxide film is formed on the semiconductor layers 122 and 124, the native oxide film is reduced by the titanium included in the barrier film, so that a preferable contact between the semiconductor layer 122 and the conductive films 147a and 147b and a preferable contact between the semiconductor layer 124 and the conductive films 148a and 148b can be provided. Further, it is also possible to stack a plurality of barrier films. In that case, for example, each of the conductive films 147a, 147b, 148a, and 148b can be formed to have a five-layer structure of titanium, titanium nitride, aluminum silicon, titanium, and titanium nitride in this order from the bottom or a stacked structure of more than five layers.

For the conductive films 147a, 147b, 148a, and 148b, tungsten silicide formed by a chemical vapor deposition method using a $WF_6$ gas and a $SiH_4$ gas may be used. Alternatively, tungsten formed by hydrogenation of $WF_6$ may be used for the conductive films 147a, 147b, 148a, and 148b.

Note that the conductive films 147a and 147b are respectively connected to the high concentration impurity regions 140a and 140b of the n-channel transistor 151. The conductive films 148a and 148b are respectively connected to the high concentration impurity regions 142a and 142b of the p-channel transistor 152.

Note that in this embodiment, the n-channel transistor 151 includes one gate electrode (the gate electrode 128), and the p-channel transistor 152 includes one gate electrode (the gate electrode 130); however, one embodiment of the disclosed invention is not limited to the above structure. The transistors may have a multi-gate structure in which a plurality of electrodes serving as gate electrodes are included and electrically connected to one another.

Note that the structure described in this embodiment can be used in appropriate combination with any of structures described in the other embodiments.

In this embodiment, a semiconductor device is manufactured using an SOI substrate having a semiconductor layer with fewer defects; thus, a highly reliable semiconductor device can be obtained.

EXAMPLE

In this example, an SOI substrate manufactured using an ion beam in which the proportion of $H_2O^+$ to $H_3^+$ is higher than 3% is described.

FIG. 3 shows mass spectra obtained by mass analysis of ion beams. In FIG. 3, a solid line represents a mass spectrum of an ion beam after irradiation carried on for 12 hours, and a dotted line represents a mass spectrum of an ion beam after irradiation carried on for 33 hours. The ion beams in FIG. 3 were produced with ISD-300SC manufactured by IHI as an ion doping apparatus. As a source gas, a 100% hydrogen gas at a flow rate of 50 sccm was used. As the conditions of irradiation with the ion beam, the acceleration voltage was 50 kV, and the beam current density was 6.35 μA/cm².

As shown in FIG. 3, not only a peak of $H_3^+$ but also a peak of $H_2O^+$ was detected. Thus, existence of $H_2O$ in the ion doping apparatus can be confirmed.

In FIG. 3, the intensity of the peak of $H_2O^+$ in the ion beam after 12-hour irradiation was 9% on the assumption that the intensity of the peak of $H_3^+$ was 100%. On the other hand, the intensity of the peak of $H_2O^+$ in the ion beam after irradiation carried on for 33-hour was 3% on the assumption that the intensity of the peak of $H_3^+$ was 100%. From FIG. 3, $H_2O^+$ can be confirmed to remain in the ion beam at 3% with respect to $H_3^+$ even after irradiation with an ion beam was carried on for 33 hours.

Figure 4A:
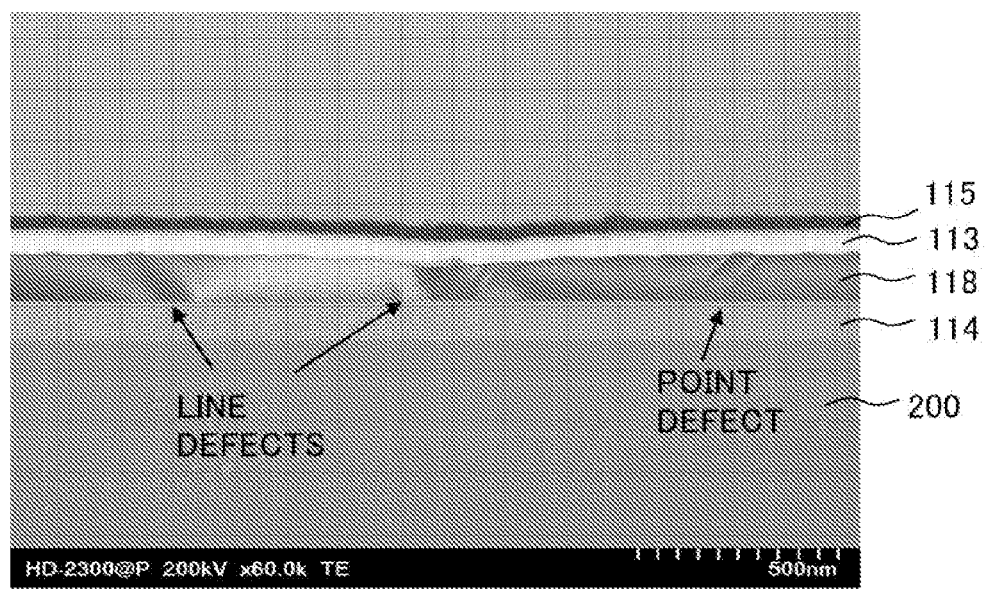
FIGS. 4A and 4B are TEM images of a semiconductor layer with defects.
Figure 4B:
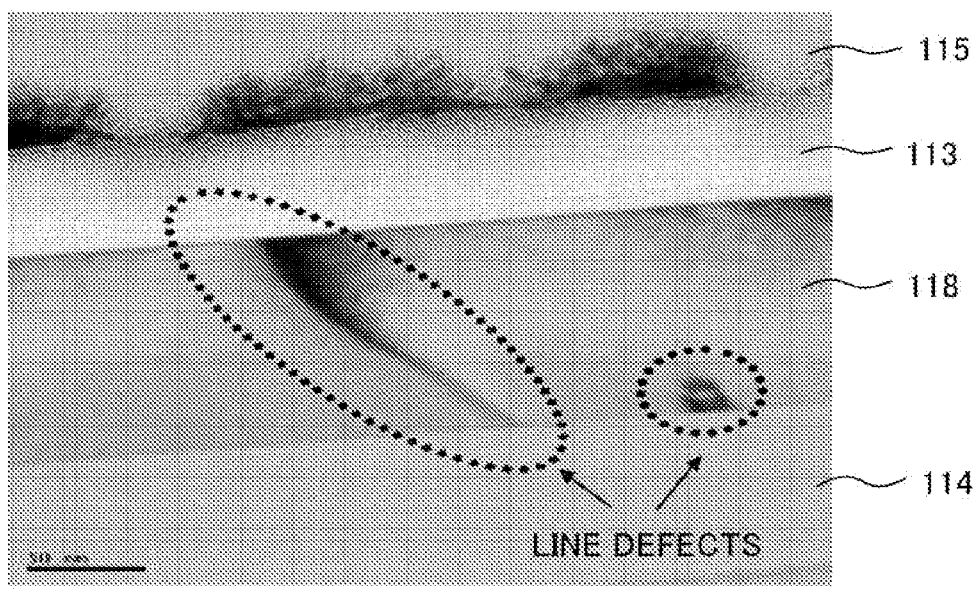

FIGS. 4A and 4B are transmission electron microscope (TEM) images of an SOI substrate which was manufactured in the following manner: a semiconductor substrate was irradiated with hydrogen ions using a gas containing oxygen (O) derived from $H_2O$ as described above, so that an embrittled region was formed; and a semiconductor layer was separated from the semiconductor substrate using the embrittled region. A region observed with the TEM, which is shown in FIGS. 4A and 4B, is a region where luminance spots described later exist.

In FIGS. 4A and 4B, a substrate 200 is a glass substrate, and an insulating layer 114 is an oxide silicon film formed by heating a silicon wafer (corresponding to the semiconductor substrate 110 in Embodiment 1) in an atmosphere containing hydrogen chloride. In addition, a semiconductor layer 118 is a silicon film obtained by being separated from the silicon wafer. For capturing images with the TEM, a carbon film 113 and a platinum film 115 were formed over the semiconductor layer 118.

FIG. 4A is an STEM image at 60,000-fold magnification, and FIG. 4B is a PC-TEM image at 5,000-fold magnification obtained with a CCD. As shown in FIGS. 4A and 4B, line defects exist in the semiconductor layer 118.

When a semiconductor device is manufactured using the semiconductor layer 118 in which the line defects exist as described above, reliability of the semiconductor device might be degraded.

Figure 5:
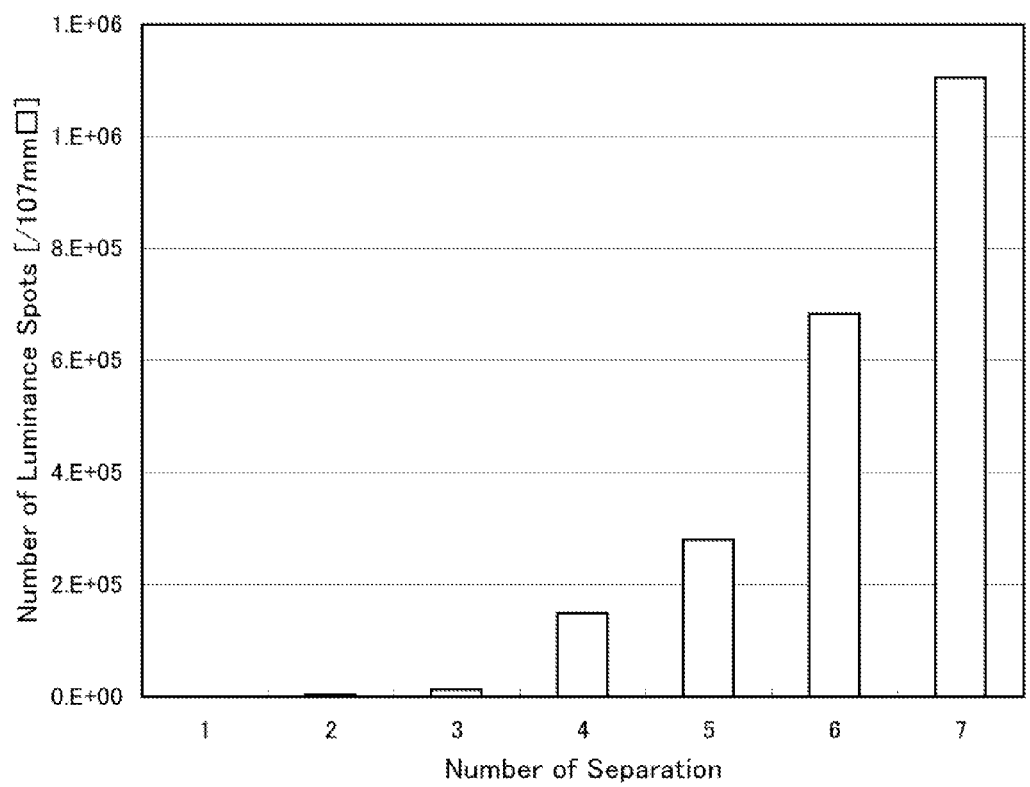
FIG. 5 is a graph showing a relation between the number of luminance spots and the number of separation.

FIG. 5 shows a relation between the number of luminance spots and the number of separation. The number of separation is the number of times of separation counted under the following conditions: a process consisting of steps illustrated in FIGS. 1A to 1C and FIGS. 2A and 2B is counted as one separation time, the semiconductor substrate 120 separated in FIG. 2A is reused as the semiconductor substrate 110 illustrated in FIG. 1A, and a semiconductor layer 116 is separated repeatedly. The number of luminance spots is the number counted by observation with an optical microscope after the semiconductor layer 118 is subjected to laser irradiation. The semiconductor layer 118 observed with the optical microscope has an area of 107 mm×107 mm.

The luminance spots observed with the optical microscope are silicon oxide formed by bonding added oxygen and silicon in the semiconductor substrate 110. As shown in FIG. 5, as the number of separation is increased, the number of luminance spots increase. It is suggested that oxygen is added every separation and accordingly silicon oxide is accumulated in the semiconductor substrate 110.

Thus, an ion beam in which the proportion of $H_2O^+$ to $H_3^+$ is lower than or equal to 3% is used for separation of the semiconductor layer 116, whereby the amount of oxygen to be added can be suppressed.

When the amount of oxygen to be added can be suppressed, a semiconductor layer in which defects derived from oxygen are reduced can be obtained.

In addition, a plurality of SOI substrates with fewer defects derived from oxygen can be obtained from one semiconductor substrate.

Furthermore, with use of an SOI substrate including a semiconductor layer in which defects derived from oxygen are reduced, a highly reliable semiconductor device can be obtained.

This application is based on Japanese Patent Application serial no. 2011-010797 filed with Japan Patent Office on Jan. 21, 2011, the entire contents of which are hereby incorporated by reference.

What is claimed is:

1. A method for manufacturing an SOI substrate comprising the steps of:
    forming an embrittled region in a semiconductor substrate by irradiating the semiconductor substrate with an ion beam in which a proportion of $H_2O^+$ to hydrogen ions ($H_3^+$) is lower than or equal to 3%;
    bonding the semiconductor substrate and a base substrate by being in contact with a surface of the semiconductor substrate and a surface of the base substrate; and
    forming a semiconductor layer over the base substrate by heating the semiconductor substrate and the base substrate and separating the semiconductor layer along the embrittled region from the semiconductor substrate which is bonded to the base substrate.

2. The method for manufacturing an SOI substrate according to claim 1, wherein, in the ion beam, a proportion of carbon (C) to the hydrogen ions ($H_3^+$) is lower than or equal to 3%.

3. The method for manufacturing an SOI substrate according to claim 1, wherein, in the ion beam, a proportion of carbon (C) to the hydrogen ions ($H_3^+$) is lower than or equal to 0.3%.

4. A method for manufacturing an SOI substrate comprising the steps of:
irradiating a semiconductor substrate with an ion beam in which a proportion of $H_2O^+$ to hydrogen ions ($H_3^+$) is lower than or equal to 0.3%, thereby forming an embrittled region in the semiconductor substrate;
bonding the semiconductor substrate and a base substrate by being in contact with a surface of the semiconductor substrate and a surface of the base substrate; and
separating a semiconductor layer along the embrittled region from the semiconductor substrate which is bonded to the base substrate by heating the semiconductor substrate and the base substrate, thereby forming the semiconductor layer over the base substrate.

5. The method for manufacturing an SOI substrate according to claim 4, wherein, in the ion beam, a proportion of carbon (C) to the hydrogen ions ($H_3^+$) is lower than or equal to 3%.

6. The method for manufacturing an SOI substrate according to claim 4, wherein, in the ion beam, a proportion of carbon (C) to the hydrogen ions ($H_3^+$) is lower than or equal to 0.3%.

7. A method for manufacturing an SOI substrate comprising the steps of:
forming a first insulating layer on a semiconductor substrate;
forming an embrittled region in the semiconductor substrate by irradiating the semiconductor substrate with an ion beam in which a proportion of $H_2O^+$ to hydrogen ions ($H_3^+$) is lower than or equal to 3%;
bonding the semiconductor substrate and a base substrate by being in contact with the first insulating layer of the semiconductor substrate and a surface of the base substrate; and
separating a semiconductor layer along the embrittled region from the semiconductor substrate which is bonded to the base substrate by heating the semiconductor substrate and the base substrate, thereby forming the semiconductor layer and at least a portion of the first insulating layer over the base substrate.

8. The method for manufacturing an SOI substrate according to claim 7, further comprising the step of forming a second insulating layer on the base substrate before the step of bonding.

9. The method for manufacturing an SOI substrate according to claim 7, wherein, in the ion beam, a proportion of carbon (C) to the hydrogen ions ($H_3^+$) is lower than or equal to 3%.

10. The method for manufacturing an SOI substrate according to claim 7, wherein, in the ion beam, a proportion of carbon (C) to the hydrogen ions ($H_3^+$) is lower than or equal to 0.3%.

11. The method for manufacturing an SOI substrate according to claim 7, wherein the proportion of $H_2O^+$ to the hydrogen ions ($H_3^+$) is lower than or equal to 0.3%.

12. The method for manufacturing an SOI substrate according to claim 11, wherein, in the ion beam, a proportion of carbon (C) to the hydrogen ions ($H_3^+$) is lower than or equal to 3%.

13. The method for manufacturing an SOI substrate according to claim 11, wherein, in the ion beam, a proportion of carbon (C) to the hydrogen ions ($H_3+$) is lower than or equal to 0.3%.

14. A method for manufacturing a semiconductor device comprising the steps of:
forming an embrittled region in a semiconductor substrate by irradiating the semiconductor substrate with an ion beam in which a proportion of $H_2O^+$ to hydrogen ions ($H_3^+$) is lower than or equal to 3%;
bonding the semiconductor substrate and a base substrate by being in contact with a surface of the semiconductor substrate and a surface of the base substrate; and
forming a semiconductor layer over the base substrate by heating the semiconductor substrate and the base substrate and separating the semiconductor layer along the embrittled region from the semiconductor substrate which is bonded to the base substrate.

15. The method for manufacturing a semiconductor device according to claim 14, wherein, in the ion beam, a proportion of carbon (C) to the hydrogen ions ($H_3^+$) is lower than or equal to 3%.

16. The method for manufacturing a semiconductor device according to claim 14, wherein, in the ion beam, a proportion of carbon (C) to the hydrogen ions ($H_3^+$) is lower than or equal to 0.3%.

17. The method for manufacturing a semiconductor device according to claim 14, wherein the proportion of $H_2O^+$ to the hydrogen ions ($H_3^+$) is lower than or equal to 0.3%.

18. The method for manufacturing a semiconductor device according to claim 17, wherein, in the ion beam, a proportion of carbon (C) to the hydrogen ions ($H_3^+$) is lower than or equal to 3%.

19. The method for manufacturing a semiconductor device according to claim 17, wherein, in the ion beam, a proportion of carbon (C) to the hydrogen ions ($H_3^+$) is lower than or equal to 0.3%.

* * * * *

UNITED STATES PATENT AND TRADEMARK OFFICE
CERTIFICATE OF CORRECTION

PATENT NO. : 8,735,263 B2  Page 1 of 1
APPLICATION NO. : 13/346754
DATED : May 27, 2014
INVENTOR(S) : Shunpei Yamazaki et al.

It is certified that error appears in the above-identified patent and that said Letters Patent is hereby corrected as shown below:

In the Specification:

Col. 8, line 44, "base substrate IOU" should read "base substrate 100"

In the Claims:

Claim 13, col. 20, line 18, "hydrogen ions ($H_3+$)" should read "hydrogen ions ($H_3^+$)"

Signed and Sealed this
Eighteenth Day of November, 2014

Michelle K. Lee
*Deputy Director of the United States Patent and Trademark Office*